United States Patent
Chiu et al.

(10) Patent No.: US 8,643,437 B2
(45) Date of Patent: Feb. 4, 2014

(54) MULTI-INPUT DIFFERENTIAL AMPLIFIER WITH DYNAMIC TRANSCONDUCTANCE COMPENSATION

(75) Inventors: Mao-Cheng Chiu, Hsinchu (TW); Chun-Yung Cho, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 58 days.

(21) Appl. No.: 13/369,315

(22) Filed: Feb. 9, 2012

(65) Prior Publication Data
US 2013/0049863 A1     Feb. 28, 2013

(30) Foreign Application Priority Data
Aug. 29, 2011 (TW) .............................. 100130929 A

(51) Int. Cl.
*H03F 3/45* (2006.01)

(52) U.S. Cl.
USPC ........................... 330/253; 330/254; 330/310

(58) Field of Classification Search
USPC ................. 330/252–261, 310, 98, 133, 150
See application file for complete search history.

(56) References Cited

U.S. PATENT DOCUMENTS 6,489,845 B1 * 12/2002 Maschhoff .................... 330/147
2013/0002353 A1 * 1/2013 Huang et al. ................. 330/253

* cited by examiner

*Primary Examiner* — Hieu Nguyen
(74) *Attorney, Agent, or Firm* — Winston Hsu; Scott Margo

(57) ABSTRACT

A multi-input differential amplifier with dynamic transconductance compensation is disclosed. The multi-input differential amplifier includes an input stage, an output stage and a transconductance compensation circuit. The input stage includes a plurality of differential input pairs, which includes a first differential input pair, a second differential input pair, a third differential input pair and a fourth differential input pair, for generating a pair of differential signals according to a first input signal, a second input signal, a third input signal, a fourth input signal, and an output signal. The output stage is utilized to generate the output signal in response to the pair of differential signals. The transconductance compensation circuit is coupled between the first and the second differential input pair, for compensating a first transconductance of the first differential input pair and a second transconductance of the second differential input pair.

20 Claims, 8 Drawing Sheets

| DACC | $V_1$ | $V_2$ | $V_3$ | $V_4$ | Ideal $V_O$ |
|---|---|---|---|---|---|
| 111 | $V_H$ | $V_H$ | $V_H$ | $V_H$ | $V_H$ |
| 110 | $V_H$ | $V_L$ | $V_H$ | $V_H$ | $(3/4)V_H+(1/4)V_L$ |
| 101 | $V_H$ | $V_H$ | $V_L$ | $V_L$ | $(2/4)V_H+(2/4)V_L$ |
| 100 | $V_H$ | $V_L$ | $V_L$ | $V_L$ | $(1/4)V_H+(3/4)V_L$ |
| 011 | $V_L$ | $V_L$ | $V_L$ | $V_L$ | $V_L$ |

FIG. 3B

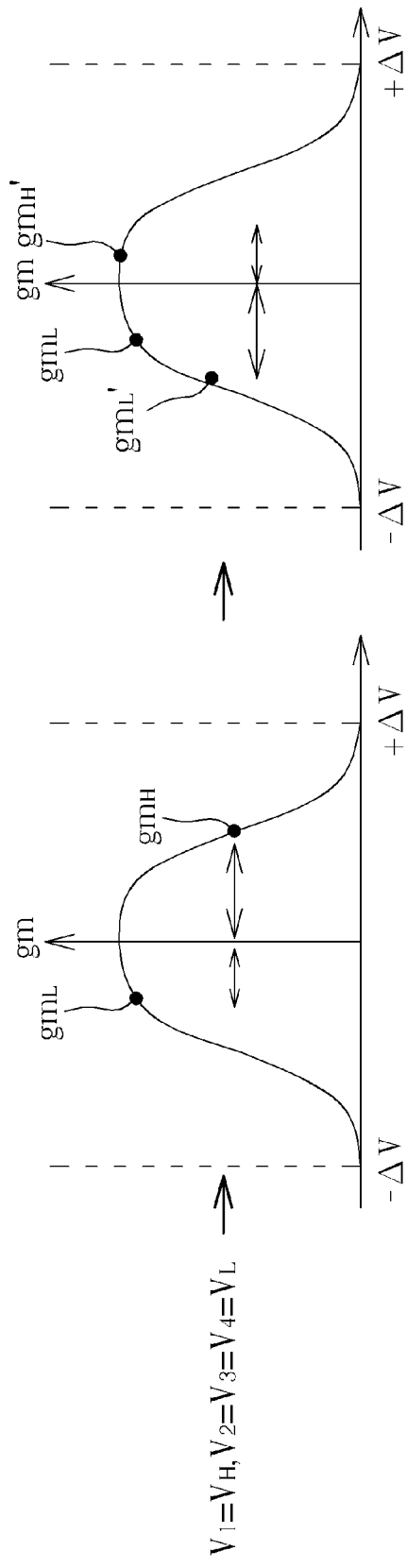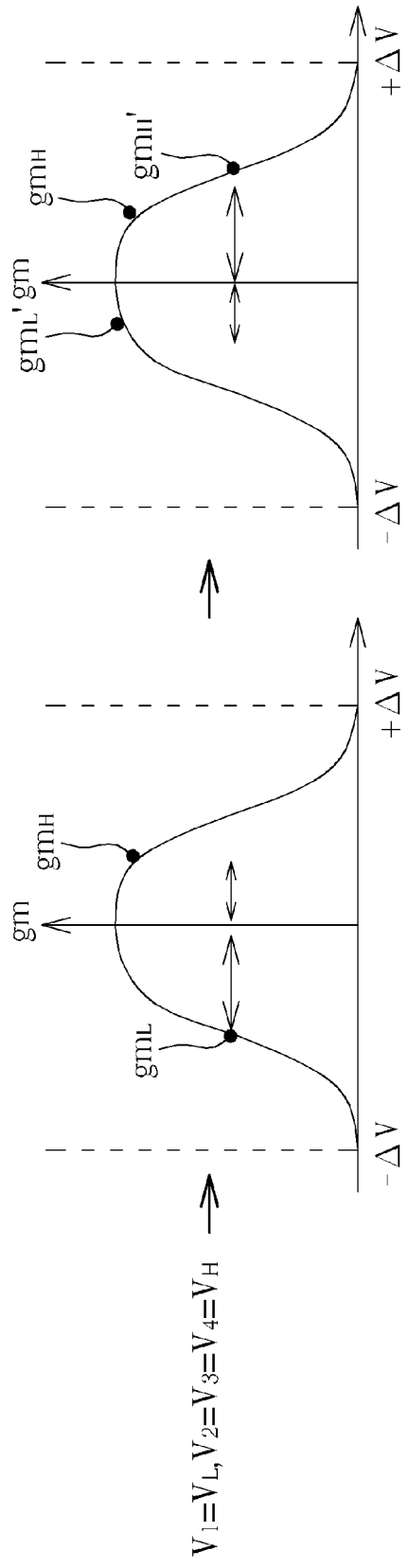
FIG. 5A
FIG. 5B

MULTI-INPUT DIFFERENTIAL AMPLIFIER WITH DYNAMIC TRANSCONDUCTANCE COMPENSATION

BACKGROUND OF THE INVENTION

1. Field of the Invention

The present invention relates to a multi-input differential amplifier, and more specifically, to a multi-input differential amplifier capable of performing dynamic transconductance compensation to enhance output voltage accuracy and increase input voltage interpolation range.

2. Description of the Prior Art

Generally, to reduce chip area, a multi-bit output buffer of a driving chip usually utilizes multi-input-pair interpolation amplifiers, which operate by inputting input voltage values with different weighting, and then generating a combined output voltage via interpolation.

For example, please refer to FIG. 1, which is a schematic diagram of a conventional eight-to-one digital analog convertor (DAC) 10. As shown in FIG. 1, the eight-to-one DAC 10 selects a suitable voltage to output from eight input voltages, according to a received 3-bit digital analog conversion code DACC. However, this architecture requires $2^3-1$ devices for selection, and is therefore costly in terms of chip area.

To reduce chip area, the prior art adopts the multiple output voltage architecture, then performs interpolation to obtain the intended output voltage. Please refer to FIG. 2A and FIG. 2B; FIG. 2A is a schematic diagram of a conventional eight-to-four DAC 20, and FIG. 2B is a schematic diagram of a conventional multi-input differential amplifier 22 for the eight-to-four DAC 20 shown in FIG. 2A. As shown in FIG. 2A and FIG. 2B, the eight-to-four DAC 20 can output a permutation of voltage levels $V_L$ or $V_H$ (level $V_L$ is lower than level $V_H$) as input voltages $V_1$-$V_4$ of the multi-input differential amplifier 22 according to the 3-bit digital analog conversion code DACC, to produce a suitable voltage level. In other words, the eight-to-four DAC 20 can generate at most eight combinations of the input voltages $V_1$-$V_4$ to the multi-input differential amplifier 22 to perform interpolation according to the 3-bit digital analog conversion code DACC, and therefore does not require eight specific input voltages for selection, thus allowing a smaller chip area than the eight-to-one DAC 10.

To implement interpolation functionality, the multi-input differential amplifier 22 is usually arranged in a unit gain buffer architecture (having an output voltage Vo fed to a negative input terminal in negative feedback), and thus it is possible to obtain a suitable output voltage Vo via performing interpolation on the input voltages $V_1$-$V_4$. In other words, it is possible to generate a suitable output voltage Vo via inputting the input voltages $V_1$-$V_4$ with different weightings of the levels $V_L$ and $V_H$ to the multi-input differential amplifier 22 for interpolation.

However, the output voltage Vo of differential input pairs of the conventional multi-input differential amplifier 22 often deviates from a designated interpolation value, thus limiting a range of possible interpolated values between levels $V_L$, $V_H$ for the input voltages $V_1$-$V_4$ of the multi-input differential amplifier 22.

SUMMARY OF THE INVENTION

An amplifier with dynamic transconductance compensation is disclosed, which can enhance output voltage accuracy and increase a possible interpolation range for input voltages.

An embodiment of the invention discloses a multi-input differential amplifier with dynamic transconductance compensation, comprising an input stage, comprising a plurality of differential input pairs, the plurality of differential input pairs comprising a first differential input pair, for generating a pair of differential signals according to a first input signal and an output signal; a second differential input pair, for generating the pair of differential signals according to a second input signal and the output signal; a third differential input pair, for generating the pair of differential signals according to a third input signal and the output signal; and a fourth differential input pair, for generating the pair of differential signals according to a fourth input signal and the output signal; an output stage, for generating the output signal in response to the pair of differential signals; and a transconductance compensation circuit, coupled between the first and the second differential input pairs, for dynamically compensating a first transconductance of the first differential input pair and a second transconductance of the second differential input pair.

Another embodiment of the invention discloses a multi-input differential amplifier with dynamic transconductance compensation, comprising an input stage, comprising a plurality of differential input pairs, for generating a pair of differential signals according to a plurality of input signals and an output signal; an output stage, for generating the output signal in response to the pair of differential signals; and one or more transconductance compensation circuits, wherein each compensation circuit is coupled between two corresponding differential input pairs of the plurality of differential input pairs, for dynamically compensating transconductances of the two corresponding differential input pairs.

Yet anther embodiment of the invention discloses a multi-input differential amplifier with dynamic transconductance compensation, comprising an input stage, comprising a plurality of differential input pairs; and one or more transconductance compensation circuits, each coupled between two corresponding pairs of the plurality of differential input pairs, wherein each the transconductance compensation circuit comprises a variable resistor, coupled between the two corresponding differential input pairs; and a resistance value controller, coupled to the variable resistor, for dynamically controlling a resistance value of the variable resistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3B is a schematic diagram of ideal values of an output voltage Vo of the differential input pairs shown in FIG. 3A under different digital analog conversion codes and corresponding input voltages.

FIG. 5A is a schematic diagram of transconductances of the differential input pairs shown in FIG. 4 when input voltages are of one high level and three low levels, respectively.

FIG. 5B input voltage is a schematic diagram of the transconductances of the differential input pairs shown in FIG. 4 when input voltages are of one low level and three high levels, respectively.

DETAILED DESCRIPTION

Figure 1:
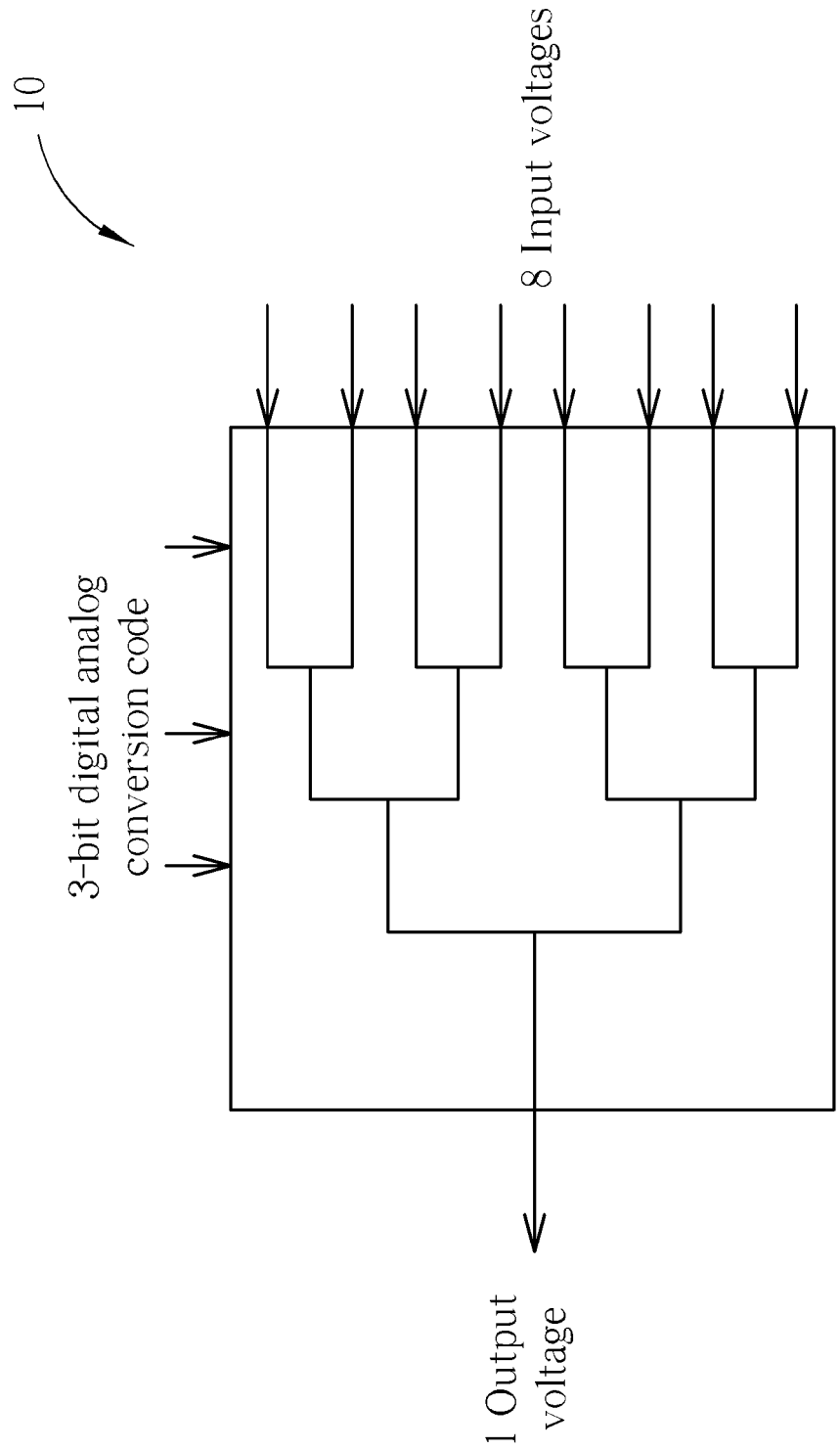
FIG. 1 is a schematic diagram of a conventional eight-to-one digital analog convertor.
Figure 2A:
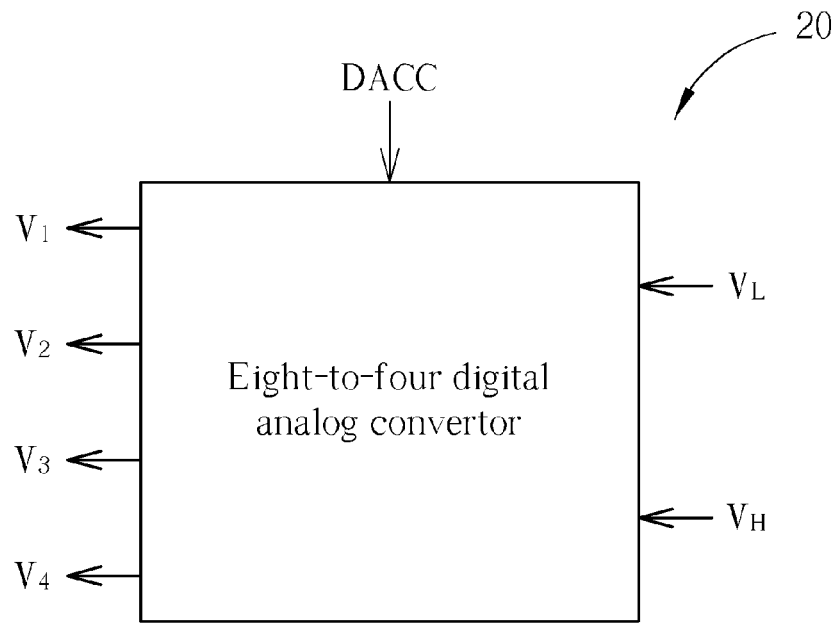
FIG. 2A is a schematic diagram of a conventional eight-to-four digital analog convertor 20.
Figure 2B:
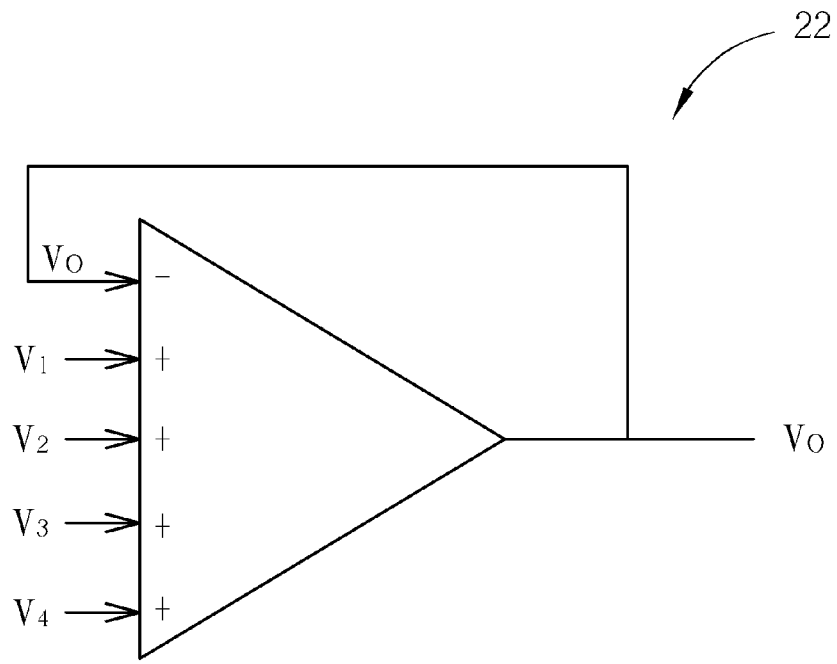
FIG. 2B is a schematic diagram of a conventional multi-input differential amplifier for the eight-to-four digital analog convertor shown in FIG. 2A.
Figure 3A:
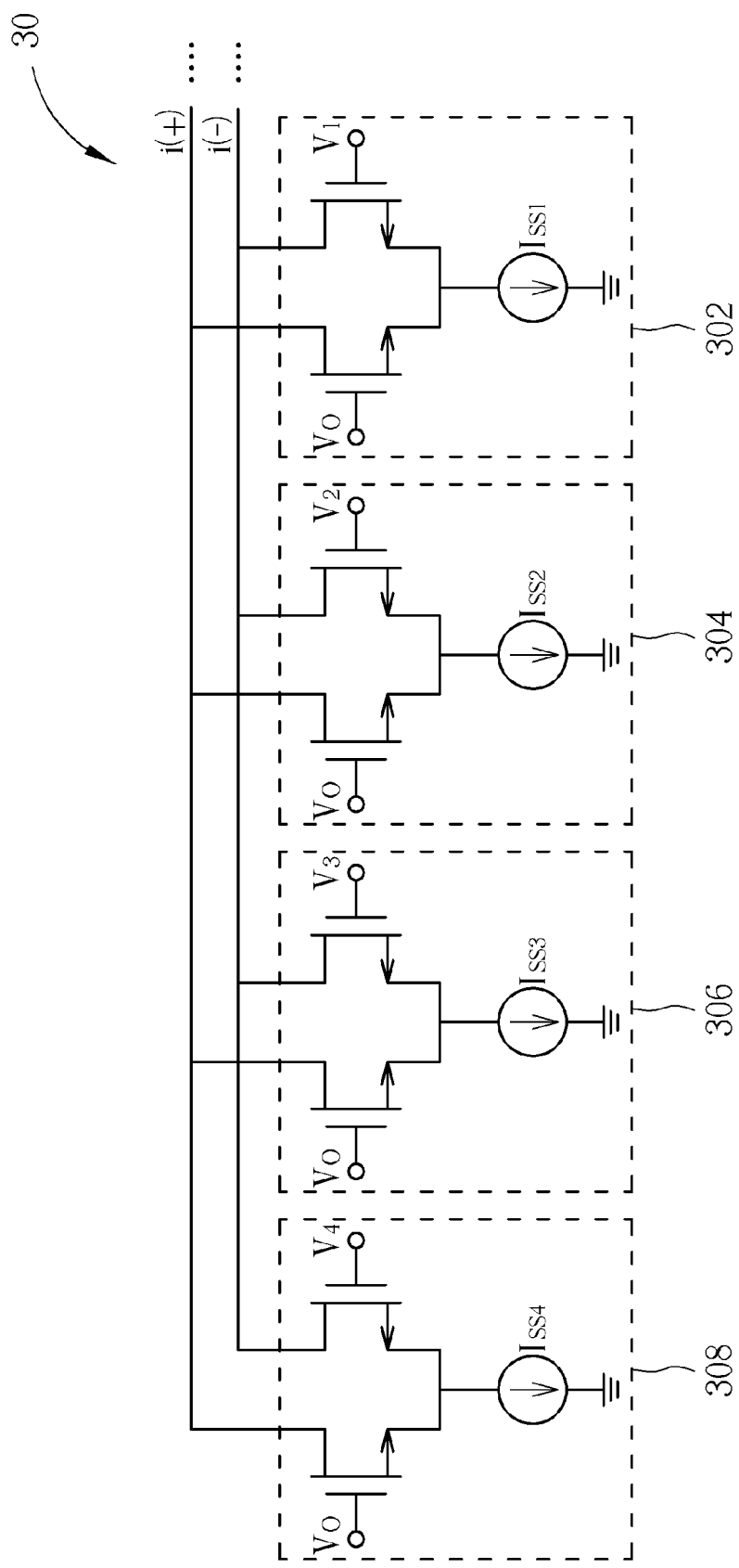
FIG. 3A is a schematic diagram of differential input pairs of an input stage of the multi-input differential amplifier shown in FIG. 2B.

Please refer to FIG. 3A and FIG. 3B. FIG. 3A is a schematic diagram of differential input pairs 302-308 of an input stage 30 of the multi-input differential amplifier 22 shown in FIG. 2B. FIG. 3B is a schematic diagram of ideal output voltages Vo of the differential input pairs 302-308 corresponding to different combinations of the input voltages $V_1$-$V_4$ and different values of a digital analog conversion code DACC. In FIG. 3A, the multi-input differential amplifier 22 includes the input stage 30, an active load, and an output stage (not shown). As shown in FIG. 3A, the input stage 30 includes four differential input pairs 302-308, and includes reference current sources $Iss_1$-$Iss_4$, respectively, to form a source follower architecture.

Under this architecture, ideally, as shown in FIG. 3B, it is assumed that the input voltages $V_1$-$V_4$ are composed of a combination of voltage levels $V_H$ and $V_L$ and that their corresponding transconductance values $gm_1$-$gm_4$ equal the transconductances $gm_H$ or $gm_L$ (e.g. when the input voltage $V_1$ is at the level $V_H$, its transconductance $gm_1$ is the transconductance value $gm_H$). It follows that when all of the input voltages $V_1$-$V_4$ are at either of the levels $V_L$ or $V_H$, the output voltage Vo would either be the level $V_L$ or the level $V_H$, respectively; when the input voltages are $V_H$, $V_L$, $V_L$, $V_L$, respectively, the output voltage Vo would be Vo=$V_L$+($V_H$−$V_L$)/4=(¼) $V_H$+(¾) $V_L$. Similarly, it is possible to obtain other interpolated levels of the ideal output voltage Vo under different combinations of the digital analog conversion code DACC and their corresponding input voltages $V_1$-$V_4$ shown in FIG. 3B.

Figure 3C:
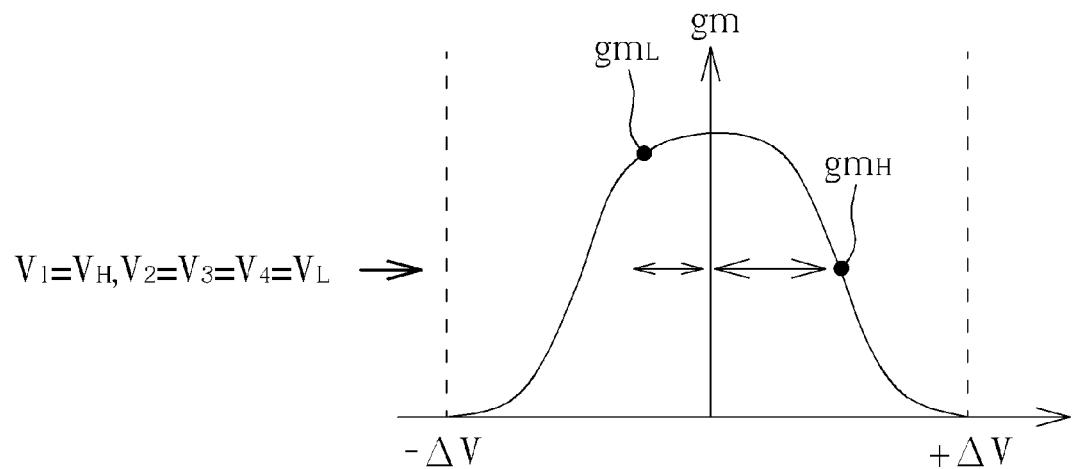
FIG. 3C is a schematic diagram of transconductances of the differential input pairs shown in FIG. 3A when input voltages are of one high level and three low levels, respectively.
Figure 3D:
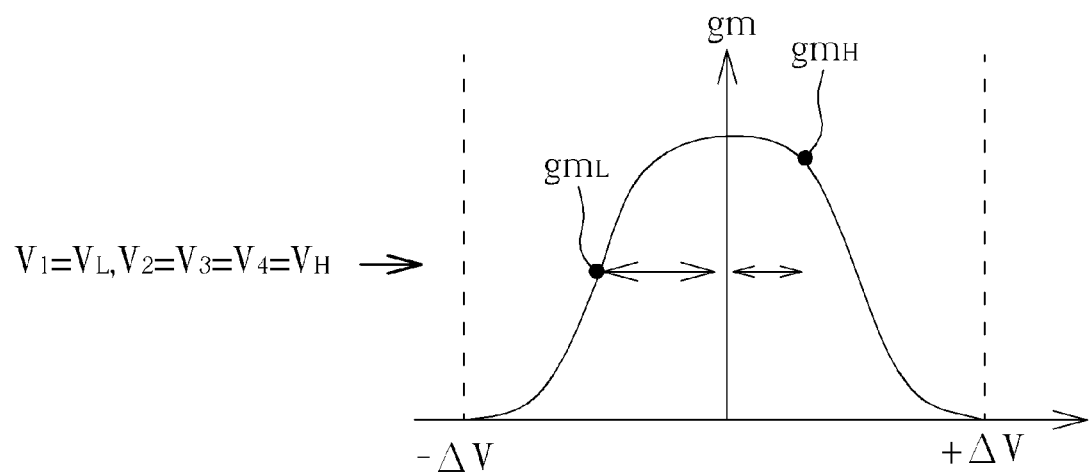
FIG. 3D is a schematic diagram of the transconductances of the differential input pairs shown in FIG. 3A when input voltages are of one low level and three high levels, respectively.

However, in reality, the differential input pairs 302-308 exhibit different transconductance values $gm_1$-$gm_4$ under different differential voltages $\Delta V_1$-$\Delta V_4$. Namely, under a different combination of weightings of the levels $V_L$, $V_H$, the differential input pairs 302-308 have different transconductances $gm_1$-$gm_4$. For example, please refer to FIGS. 3C to 3D. FIG. 3C is a schematic diagram of the transconductances $gm_1$-$gm_4$ of the differential input pairs 302-308 shown in FIG. 3A when the input voltages $V_1$-$V_4$ are at the levels $V_H$, $V_L$, $V_L$, $V_L$, respectively. FIG. 3D is a schematic diagram of the transconductances $gm_1$-$gm_4$ of the differential input pairs 302-308 shown in FIG. 3A when the input voltages $V_1$-$V_4$ are at the levels $V_L$, $V_H$, $V_H$, $V_H$, respectively. As shown in FIGS. 3C and 3D, the transconductances $gm_1$-$gm_4$ of the differential input pairs 302-308 would decrease with an increase in the differential voltages $\Delta V_1$-$\Delta V_4$, i.e. an increase in the voltage difference between the input voltages $V_1$-$V_4$ and the output voltage Vo. Therefore, the realistic interpolated output voltage Vo of the multi-input differential amplifier 22 may be expressed as:

$$Vo = \frac{Ngm_H V_H + Mgm_L V_L}{Ngm_H + Mgm_L}$$

wherein N and M indicate how many of the levels $V_H$ and $V_L$ are present within the input voltages $V_1$-$V_4$, respectively, and the transconductance values $gm_H$ and $gm_L$ are the transconductance values $gm_1$-$gm_4$ of the differential input pairs 302-308 when the input voltages $V_1$-$V_4$ are at the levels $V_H$ and $V_L$, respectively.

In such a case, it is still possible for the output voltage Vo to equal the ideal interpolated values shown in FIG. 3B when the differential voltages $\Delta V_1$-$\Delta V_4$ between the input voltages $V_1$-$V_4$ and the output voltage Vo are the same, and the differential input pairs 302-308 of the multi-input differential amplifier 22 have the same transconductances $gm_1$-$gm_4$ (i.e. when all of the input voltages $V_1$-$V_4$ are at either of the level $V_H$ or the level $V_L$, or when two of the input voltages $V_1$-$V_4$ are at the level $V_H$ while the other two are at the level $V_L$). However, when the input voltages $V_1$-$V_4$ are at the levels $V_H$, $V_L$, $V_L$, $V_L$, respectively, the ideal output voltage Vo would be Vo=$V_L$+($V_H$−$V_L$)/4=(¼) $V_H$+(¾)$V_L$, and the differential voltages $\Delta V_1$-$\Delta V_4$ of the differential input pairs 302-308 would be $$\Delta V_1 = \frac{3}{4}(V_H - V_L),\ \Delta V_2 = \Delta V_3 = \Delta V_4 = \frac{-1}{4}(V_H - V_L),$$

respectively. Therefore, a pair of differential signals i(+), i(−) of the differential input pairs 302-308 (i.e. a positive terminal current and a negative terminal current), respectively, can be expressed as:

$$i(+) = \frac{1}{2}gm_H \Delta V_1 + \frac{1}{2}gm_L \Delta V_2 + \frac{1}{2}gm_L \Delta V_3 + \frac{1}{2}gm_L \Delta V_4 =$$
$$\frac{3}{8}(V_H - V_L)(gm_H - gm_L)$$

$$i(-) = -\frac{1}{2}gm_H \Delta V_1 - \frac{1}{2}gm_L \Delta V_2 - \frac{1}{2}gm_L \Delta V_3 - \frac{1}{2}gm_L \Delta V_4 =$$
$$-\frac{3}{8}(V_H - V_L)(gm_H - gm_L)$$

In such a case, as shown in FIG. 3C, since the differential voltage $\Delta V_1$ of the differential input pair 302 is greater than that of the differential voltages $\Delta V_2$-$\Delta V_4$ of the differential input pairs 304-308, (i.e. the level $V_L$ has a greater weighting, and thus the differential input pair 302 with level $V_H$ as the input voltage $V_1$ would have a greater differential voltage $\Delta V_1$, |$\Delta V_1$|>|$\Delta V_2$|~|$\Delta V_4$|), and therefore the corresponding transconductance value $gm_H$ of the transconductance $gm_1$ of the differential input pair 302 would be lower than the corresponding transconductance value $gm_L$ of the transconductances $gm_2$-$gm_4$ of the differential input pairs 304-308 ($gm_H$<$gm_L$). Substituting into the above expression, it can be derived that the negative terminal current i(−) would be greater than the positive terminal current i(+). Using negative feedback analysis, it can be shown that the feedback voltage at the negative terminal would decrease, forcing the positive terminal current i(+) and the negative terminal current i(−) of the differential input pairs 302-308 to return to the equal state (with the positive terminal current i(+) equal to the negative terminal current i(−)). Therefore, the actual output voltage Vo shown in FIG. 3B would be slightly lower than the ideal output voltage Vo.

In other words, as can be known from the above-mentioned expression for the realistic interpolated output voltage Vo, the differential input pair 302 with the level $V_H$ as the input voltage $V_1$ has a greater differential voltage $\Delta V_1$ (and in turn, a smaller transconductance $gm_1$), causing the higher voltage level $V_H$ to have a lower component weighting. Therefore, the output voltage Vo would be slightly lower than the ideal value. Similarly, referring to FIG. 3D, it is possible to derive that when the input voltages $V_1$-$V_4$ are the levels $V_L$, $V_H$, $V_H$, $V_H$, respectively, the actual output voltage Vo would be slightly higher than the ideal output voltage Vo shown in FIG. 3B.

For example, when $V_2=V_3=V_4=V_L=4V$, $V_1=V_H=5V$, the ideal interpolated output voltage Vo should be 4.25V. However, the corresponding transconductances $gm_1$-$gm_4$ of the differential input pairs 302-308 deviate to $gm_L=0.025$ mS, $gm_H=0.018$ mS, respectively, causing a bias in the interpolated output voltage Vo. Therefore, it can be shown from the aforementioned formula for the interpolated output voltage Vo that $V_o=4.1935V$, which amounts to an error value of −5.6 mV.

In summary, in the low-current driving amplifier implemented by performing interpolation in the multi-input differential amplifier 22, since the transconductance values of each input pair deviate with the differential voltages $\Delta V_1$-$\Delta V_4$ (i.e. voltage differences between the input voltages $V_1$-$V_4$ and the output voltage Vo), therefore when the levels $V_L$, $V_H$ do not have an even weighting within the input voltages $V_1$-$V_4$ of the multi-input differential amplifier 22, the transconductance values of each input pair would vary with according to changes in the differential voltages. As a result, the output voltage Vo would deviate from the designed interpolated value, thereby limiting the range of possible interpolated values between the levels $V_L$, $V_H$ for the input voltages $V_1$-$V_4$ of the multi-input differential amplifier 22.

Figure 4:
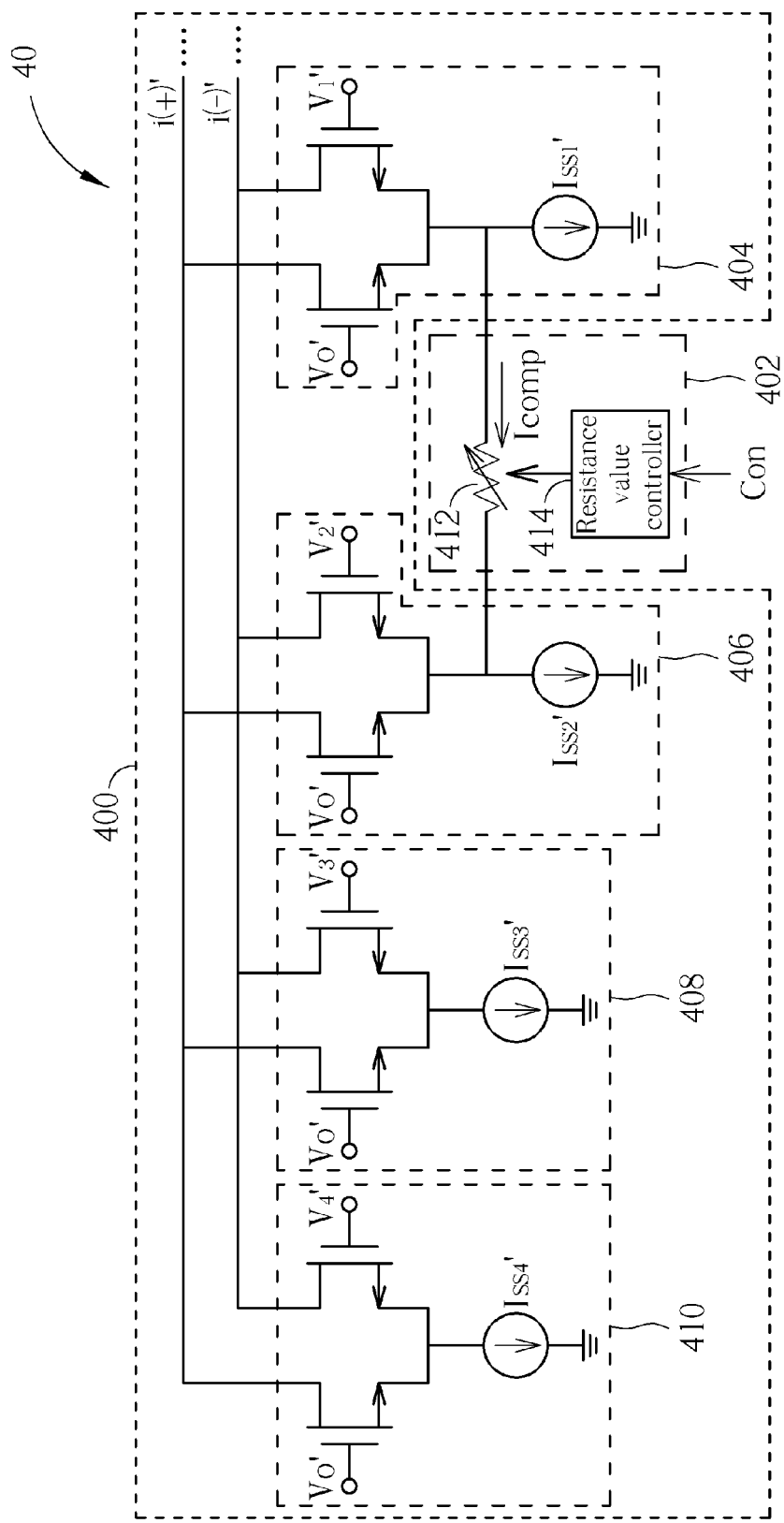
FIG. 4 is a schematic diagram of a multi-input differential amplifier with dynamic transconductance compensation according to an embodiment.

Please refer to FIG. 4, which is a schematic diagram of a multi-input differential amplifier 40 with dynamic transconductance compensation according to an embodiment. The differential amplifier 40 can effectively improve errors in the output voltage Vo, thereby effectively improving the possible interpolation range for the input voltages.

As shown in FIG. 4, the multi-input differential amplifier 40 includes an input stage 400, and rear-stage circuit, e.g. an output stage (not shown). Moreover, the multi-input differential amplifier 40 further includes a transconductance compensation circuit 402. The input stage 400 includes four pairs of differential input pairs 404-410, which include reference current sources $Iss_1'$-$Iss_4'$, respectively, to form source followers. Note that, in other embodiments, any other number of differential pairs is possible, and is not limited thereto. The multi-input differential amplifier 40 and the multi-input differential amplifier 22 are similar in that each of the differential input pairs 404-410 are generates a pair of differential signals i(+)', i(−)' (e.g. a positive terminal current and a negative terminal current), respectively, according to the input signals $V_1'$-$V_4'$ and an output signal Vo' (e.g. the input voltage and the output voltage, respectively). The output stage generates the output signal Vo' in response to the pair of differential signals i(+)', i(−)', then inputs the output signal Vo' to the negative input terminal of the differential input pairs 404-410 as negative feedback (similar to FIG. 2B). All of the input signals $V_1'$-$V_4'$ may switch between different voltage levels, e.g. the levels $V_L$, $V_H$, in order to produce the intended interpolated output signal Vo' (wherein level $V_H$ is higher than level $V_L$). However, as will be illustrated below, during actual operations of the multi-input differential amplifier 40, the input signals $V_1'$-$V_4'$ may be controlled to switch between several specific combinations.

A primary distinction between the multi-input differential amplifier 40 and the multi-input differential amplifier 22 is that the multi-input differential amplifier 40 further includes a transconductance compensation circuit 402 coupled to the differential input pairs 404 and 406, for compensating a transconductance $gm_1'$ of the differential input pair 404 and a transconductance $gm_2'$ of the differential input pair 406, such that the output signal Vo' has an intended value (e.g. the ideal values shown in FIG. 3B). As such, by utilizing the transconductance compensation circuit 402 to perform compensation on the transconductances $gm_1'$ and $gm_2'$, a higher of the two transconductances is decreased, and a lower of the two is increased. In this way, the bias in transconductance values caused by differences in the differential voltages can be compensated for, and in turn the output signal Vo' can fulfill an expected value, thereby increasing the possible range of interpolation for the input voltages.

In more detail, as shown in FIG. 4, the transconductance compensation circuit 402 is coupled between reference current sources $Iss_1'$ and $Iss_2'$, to compensate for the transconductances $gm_1'$ and $gm_2'$ via a compensation current Icomp flowing between the reference current sources $Iss_1'$ and $Iss_2'$. In the configuration shown in FIG. 4, since all of the reference current sources $Iss_1'$-$Iss_4'$ are fixed-value current sources, the compensation current Icomp would flow through the transconductance compensation circuit 402 from one reference current source to another. As the compensation current Icomp flows, a corresponding out-flowing differential input pair of the compensation current Icomp would have a higher current, and therefore its transconductance value increases; similarly, a corresponding in-flowing differential input pair of the compensation current Icomp would have a lower current, and thus its transconductance value decreases. As such, the transconductance compensation circuit 402 can compensate for the transconductances $gm_1'$ and $gm_2'$ by flowing the compensation current Icomp between the reference current sources $Iss_1'$ and $Iss_2'$, to control the output signal Vo' to be an intended value.

Preferably, the transconductance compensation circuit 402 may operate when the input signals $V_1'$ and $V_2'$ are at different levels, while the other two input signals $V_3'$, $V_4'$ remain at substantially same levels. More specifically, when one of the input signals $V_1'$, $V_2'$ is at either one of the levels $V_H/V_L$, while the other one of the input signals $V_1'$, $V_2'$, as well as the two other input signals $V_3'$, $V_4'$ are all at the level $V_L/V_H$ (i.e. configured with reverse levels), the transconductance compensation circuit 402 may increase one of the transconductances $gm_1'$, $gm_2'$ corresponding to the transconductance of the input signal (i.e. one of the input signals $V_1'$, $V_2'$ which has a different level as the other two input signals $V_3'$, $V_4'$), and reduce one of the transconductances $gm_1'$, $gm_2'$ corresponding to the transconductance of the other input signal (i.e. the signal within the input signals $V_1'$, $V_2'$ which has the same level as the other two input signals $V_3'$, $V_4'$). As such, since the larger of the differential voltages would have a lower transconductance value, the compensation circuit 402 may compensate for the levels of the input signals $V_1'$, $V_2'$ which is different from all other levels of the input voltages $V_1'$-$V_4'$, allowing the output signal Vo' to be the expected value.

For example, please refer to FIGS. 5A and 5B. FIG. 5A is a schematic diagram of the transconductance $gm_1'$-$gm_4'$ of the differential input pairs 404-410 shown in FIG. 4 when the input voltages $V_1'$-$V_4'$ are at the levels $V_H$, $V_L$, $V_L$, $V_L$, respectively. FIG. 5B is a schematic diagram of the transconductance $gm_1'$-$gm_4'$ of the differential input pairs 404-410 shown in FIG. 4 when the input voltages $V_1'$-$V_4'$ are at the levels $V_L$, $V_H$, $V_H$, $V_H$, respectively. As shown in FIG. 5A, when the input signal $V_1'$ is at the level $V_H$ and the input signals $V_2'$-$V_4'$ are at the level $V_L$, the transconductance compensation circuit 402 increases the transconductance $gm_1'$ and decreases the transconductance $gm_2'$. In other words, the transconductance compensation circuit 402 increases the transconductance $gm_1'$ from its original transconductance value $gm_H$ to a new transconductance value $gm_H'$, and decreases the transconductance $gm_2'$ from its original transconductance value $gm_L$ to a new transconductance value $gm_L'$, whereas the transconductances $gm_3'$, $gm_4'$ are maintained at the transconductance value $gm_L$.

On the other hand, as shown in FIG. 5B, when the input signal $V_1'$ is at the level $V_L$ and the input signals $V_2'$-$V_4'$ are at the level $V_H$, the transconductance compensation circuit 402 also increases the transconductance $gm_1'$ and decreases the transconductance $gm_2'$. In other words, the transconductance compensation circuit 402 increases the transconductance $gm_1'$ from its original transconductance value $gm_L$ to the transconductance value $gm_L'$, and decreases the transconductance $gm_2'$ from its original transconductance value $gm_H$ to the transconductance value $gm_H'$, whereas the transconductances $gm_3'$, $gm_4'$ are maintained at the transconductance value $gm_H$. Similarly, when the level of the input signal $V_2'$ is different from that of the other three input signals, the transconductance compensation circuit 402 can also increase the transconductance $gm_2'$ and decrease the transconductance $gm_1'$. As such, since the larger of the differential voltages would have a smaller transconductance value, the compensation circuit 402 can compensate for the signal in the input signals $V_1'$, $V_2'$ which has a different level than all of the other input voltages $V_1'$-$V_4'$, such that the output signal Vo' would have the expected value.

The following are more detailed descriptions; please continue to refer to FIG. 4. In an embodiment, each of the differential input pairs 404-410 includes an N-type input transistor pair, when the input signal $V_1'$ is at a first/second level, the input signal $V_2'$ is at a second/first level, and both of the input signals $V_3'$, $V_4'$ are at the second/first level, the transconductance compensation circuit 402 increases a transconductance $gm_{1N}'$ of the N-type of the input transistor pair of the differential input pair 404, and decreases a transconductance $gm_{2N}'$ of the N-type input transistor pair of the differential input pair 406. In such a case, when the input signal $V_1'$ is at the level $V_H$ and the input signals $V_2'$-$V_4'$ are at the level $V_L$, since the input signal $V_1'$ is greater than the input signal $V_2'$, the transconductance compensation circuit 402 would make the compensation current Icomp flow from the reference current source $Iss_1'$ to the reference current source $Iss_2'$, such that a current (and, in turn, its transconductance $gm_{1N}'$) of the N-type input transistor pair of the differential input pair 404 increases, while a current (and, in turn, its transconductance $gm_{2N}'$) of the N-type input transistor pair of the differential input pair 406 decreases, such that the output signal Vo' would have the intended value.

Figure 6:
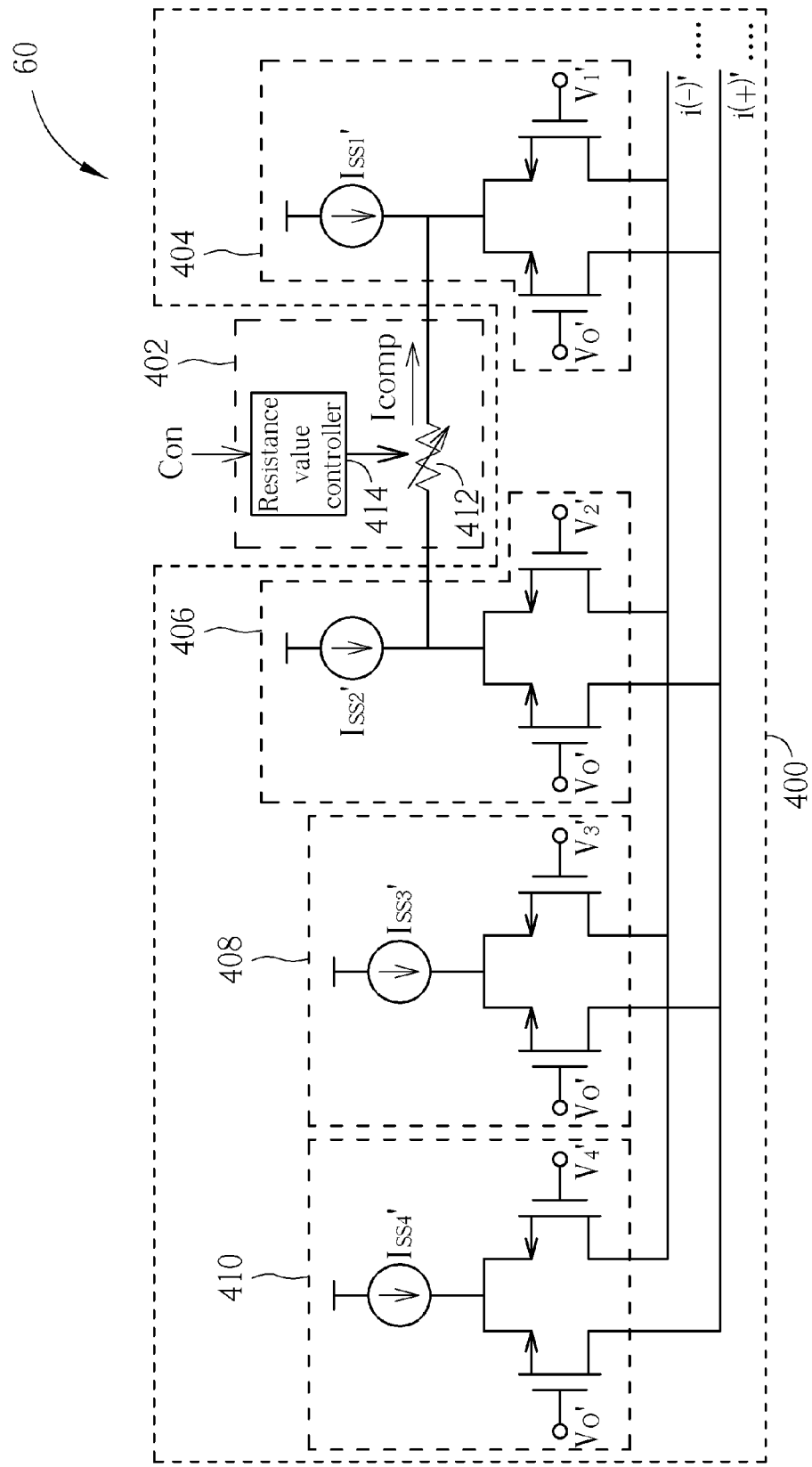
FIG. 6 is a schematic diagram of a multi-input differential amplifier with dynamic transconductance compensation according to another embodiment.

On the other hand, please refer to FIG. 6, which is a schematic diagram of a multi-input differential amplifier 40 with dynamic transconductance compensation according to another embodiment. The only distinction between FIGS. 6 and 4 is that the input transistor pairs are changed from N-type to P-type, and the direction of the compensation current Icomp is reversed, and therefore the same component symbols are used. As shown in FIG. 6, in another embodiment, each of the differential input pairs 404-410 further includes a P-type input transistor pair.

Similarly, the transconductance compensation circuit 402 may also operate when the input signals $V_1'$ and $V_2'$ are at different levels, while the other two input signals $V_3'$, $V_4'$ are at the substantially same levels. More specifically, when the input signal $V_1'$ is at the first/second level, the input signal $V_2'$ is at the second/first level, and both of the input signals $V_3'$, $V_4'$ are at the second/first level, the transconductance compensation circuit 402 increases the transconductance $gm_{1P}'$ of the P-type input transistor pair of the differential input pair 404, and decreases the transconductance $gm_{2P}'$ of the P-type input transistor pair of the differential input pair 406. For example, when the input signal $V_2'$ is at the level $V_L$ and the input signals $V_1'$, $V_3'$, $V_4'$ are at the level $V_H$, since the input signal $V_2'$ is greater than the input signal $V_1'$, the transconductance compensation circuit 402 would make the compensation current Icomp flow from the reference current source $Iss_2'$ to the reference current source $Iss_1'$, such that the current (and in turn, its transconductance $gm_{2P}'$) of the P-type input transistor pair of the differential input pair 406 decreases, and the current (and in turn, its transconductance $gm_{1P}'$) of the P-type input transistor pair of the differential input pair 404 increases, thereby giving the output signal Vo' its expected value.

Note that, when the input signals $V_1'$ and $V_2'$ are at substantially same levels, the transconductance compensation circuit 402 does not need to compensate for the transconductances $gm_1'$, $gm_2'$. As shown in FIG. 3B, during actual operation of the multi-input differential amplifier 40, the output signal Vo' is also interpolated using variations in the input signals $V_1'$, $V_2'$ only, while maintaining the input signals $V_3'$, $V_4'$ to be the same. Therefore the transconductance compensation circuit 402 may perform compensation only when the input signals $V_1'$ and $V_2'$ are at different levels, and not perform compensation when the input signals $V_1'$ and $V_2'$ are at the substantially same levels.

Moreover, in practice, it may be preferred that a switching of voltage levels is avoided. In other words, it is possible to arrange the first differential input pair 404 to continuously receive the input voltage $V_1$ of the high level $V_H$, and only switch to the low level $V_L$ when the intended output signal Vo' is at the low level $V_L$. It is further possible to arrange the two differential input pairs 408 and 410 to continuously receive the input signals $V_3$ and $V_4$ of the same levels. As such, the transconductance compensation circuit 402 only needs to be disposed between the differential input pair 404 which continuously receive the high level $V_H$ input, and another differential input pair 406 which varies according to the intended output signal Vo'. Thus, it is unnecessary to dispose a transconductance compensation circuit 402 between every two differential input pairs.

Please refer back to FIG. 4, which also displays a detailed structure of the transconductance compensation circuit 402 according to an embodiment. The transconductance compensation circuit 402 may also include a variable resistor 412 and a resistance value controller 414. The variable resistor 412 is coupled between the reference current source $Iss_1'$ and the reference current source $Iss_2'$, and can provide a current path to compensate for the transconductances $gm_1'$ and $gm_2'$. The resistance value controller 414 is coupled to the variable resistor 412, for controlling a resistance value R of the variable resistor 412 in response to a control signal Con corresponding to the levels of the input signals $V_1'$, $V_2'$. For example, the resistance value controller 414 may control the resistance value R of the variable resistor 412 according to the control signal Con of the eight-to-four DAC 20 shown in FIG. 2A. Therefore, the resistance value controller 414 may control the variable resistor 412 to be a suitable resistance value R to perform compensation on the transconductances $gm_1'$, $gm_2'$ when the input voltages $V_1'$, $V_2'$ are at different levels, and the resistance value controller 414 may control the variable resistor 412 to be a high resistance value to cut off the current path and not perform compensation on the transconductances $gm_1'$, $gm_2'$ when the input voltages $V_1'$, $V_2'$ are at the substantially same levels.

Specifically, please refer to FIGS. 4 and 5A together. When the input signals $V_1'$-$V_4'$ are at the levels $V_H$, $V_L$, $V_L$, $V_L$, respectively, the transconductances $gm_1'$-$gm_4'$ should originally be the transconductance values $gm_H$, $gm_L$, $gm_L$, $gm_L$, respectively. However, the resistance value controller 414 may control the variable resistor 412 to be a suitable resistance value R, so as to compensate for the transconductances $gm_1'$-$gm_4'$ to be the transconductance values $gm_H'$, $gm_L'$, (i.e. $gm_H'=gm_H+gm$ and $gm_L'=gm_L-gm$). Ideally, the output signal Vo' should be $Vo=V_L+(V_H-V_L)/4$, and the differential voltages $\Delta V_1'$-$\Delta V_4'$ of the differential input pairs 404-410 should be $$\Delta V_1' + \frac{3}{4}(V_H - V_L), \Delta V_2' = \Delta V_3' = \Delta V_4' = \frac{-1}{4}(V_H - V_L),$$

the pair of differential signals $i(+)'$, $i(-)'$ of the differential input pairs 404-410, respectively, should be:

$$i(+)' = \frac{1}{2}gm_L\left[-\frac{1}{4}(V_H - V_L)\right] + \frac{1}{2}gm_L\left[-\frac{1}{4}(V_H - V_L)\right] +$$
$$\frac{1}{2}(gm_L - \Delta gm)\left[-\frac{1}{4}(V_H - V_L)\right] + \frac{1}{2}(gm_H + \Delta gm)\left[-\frac{3}{4}(V_H - V_L)\right]$$
$$i(-)' = -\frac{1}{2}gm_L\left[-\frac{1}{4}(V_H - V_L)\right] - \frac{1}{2}gm_L\left[-\frac{1}{4}(V_H - V_L)\right] -$$
$$\frac{1}{2}(gm_L - \Delta gm)\left[-\frac{1}{4}(V_H - V_L)\right] - \frac{1}{2}(gm_H + \Delta gm)\left[-\frac{3}{4}(V_H - V_L)\right]$$

To ensure the output signal Vo' fulfills the requirement $Vo=V_L+(V_H-V_L)/4$, the pair of differential signals $i(+)'$, $i(-)'$ should satisfy $(+)'=i(-)'=0$, and the above expressions may be simplified to obtain $$\Delta gm = \frac{3}{4}(gm_L - gm_H).$$

Also, since $$\frac{gm_H}{gm_L} = k,$$

it may be derived that when the input signals $V_1'$-$V_4'$ are at the levels $V_H$, $V_L$, $V_L$, $V_L$, respectively, the resistance value controller 414 may control the resistance value R of the variable resistor 412 to be $$R = \frac{8(V_H - V_L)}{(15 - 6k - 9k^2)I_{ss}}.$$

The above expression shows that the resistance value controller 414 may decide the resistance value R of the variable resistor 412 according to differences of the levels $V_H$, $V_L$, a reference current value Iss of the reference current sources $Iss_1'$ and $Iss_2'$ and original values $gm_H$, $gm_L$ of the transconductances $gm_1'$, $gm_2'$ continuing to refer to FIGS. 5B and 6, when the input signals $V_1'$-$V_4'$ are at the levels $V_L$, $V_H$, $V_H$, $V_H$, respectively, the transconductance compensation circuit 402 performs the compensation mechanism. As such, the transconductance compensation circuit 402 can ensure that the output signal Vo' is the expected value, thereby increasing the interpolation range of the input voltages. Additionally, since the source voltage and input voltage of the differential input pairs are in phase with each other, when the difference between the levels $V_H$ and level $V_L$ increases, the compensation gm also increases, to achieve dynamic compensation.

For example, when $V_2'=V_3'=V_4'=V_L=4V$, $V_1'=V_H=5V$, the ideal interpolated output voltage Vo' should be 4.25V, and after the transconductance compensation circuit 402 modulates the N-type input transistor pair of the differential input pairs 404, 406, the transconductance $gm_2$ of the differential input pair 406 can be reduced from $gm_L$=0.025 mS to $gm_L'$=0.02 mS, and the transconductance $gm_1$ of the differential input pair 404 can be increased from $gm_H$=0.018 mS to $gm_H'$=0.0233 mS. Thus, it can be derived from the formula $$Vo = \frac{Ngm_H V_H + Mgm_L V_L}{Ngm_H + Mgm_L}$$

that the output signal Vo' is 4.2497V, which now has only a 0.3 mV error after correction. Compared to the −5.6 mV error without compensation in the prior art, the transconductance compensation circuit 402 corrects the output signal Vo' to be the expected value, thereby increasing the possible interpolation range for the input voltages.

Note that, the spirit of the embodiments of the invention is to utilize a transconductance compensation circuit 402 between a differential input pair having a different input signal level than other differential input pairs and another differential input pair to perform compensation on the transconductances of the two differential pairs, such that a higher transconductance value decreases and a lower transconductance value increases. In this way, the transconductance value differences caused by different differential voltages can be compensated for, and the output signal Vo' can meet the expected value, thereby increasing the possible interpolation range of the input voltages. Those skilled in the art may make modifications or variations, and are not limited thereto. For example, all of the above-mentioned embodiments utilize four differential input pairs and one transconductance compensation circuit as an illustration. In actual applications, a quantity of the differential input pairs is not limited to four, and the multi-input differential amplifier 40 may include one or more transconductance compensation circuits, wherein each compensation circuit can be coupled between two corresponding pairs of the plurality of differential input pairs, so as to compensate for the transconductances of the two corresponding differential input pairs, and ensure that the output signal Vo' fulfills an intended value. Moreover, FIGS. 4 and 6 may be combined in implementation.

In the conventional multi-input differential amplifier 22, the transconductances $gm_1$-$gm_4$ of the differential input pairs 302-308 would have different transconductance values when the differential voltages $\Delta V_1$-$\Delta V_4$ vary, causing the output voltage Vo to deviate from the designed interpolated value, and thereby limiting the possible interpolation range between the levels $V_L$, $V_H$ for the input voltages $V_1$-$V_4$ of the multi-input differential amplifier 22. In comparison, the above-mentioned embodiment adds a transconductance compensation circuit between two differential input pairs, so as to dynamically compensate for the transconductances of the two corresponding differential input pairs under suitable combinations of the input levels. As such, the output signal Vo' can be ensured to meet an expected value, and the interpolation range of the input voltages may be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-input differential amplifier with dynamic transconductance compensation, comprising:
   an input stage, comprising a plurality of differential input pairs, the plurality of differential input pairs comprising:
      a first differential input pair, for generating a pair of differential signals according to a first input signal and an output signal;
      a second differential input pair, for generating the pair of differential signals according to a second input signal and the output signal;
      a third differential input pair, for generating the pair of differential signals according to a third input signal and the output signal; and
      a fourth differential input pair, for generating the pair of differential signals according to a fourth input signal and the output signal;
   an output stage, for generating the output signal in response to the pair of differential signals; and
   a transconductance compensation circuit, coupled between the first and the second differential input pairs, for dynamically compensating a first transconductance of the first differential input pair and a second transconductance of the second differential input pair.

2. The multi-input differential amplifier of claim 1, wherein the transconductance compensation circuit receives a control signal to dynamically compensate the first and second transconductances, wherein the control signal corresponds to a level combination of the first to fourth input signals.

3. The multi-input differential amplifier of claim 1, wherein the first differential input pair comprises a first reference current source, the second differential pair comprises a second reference current source, and the transconductance compensation circuit is coupled between the first reference current source and the second reference current source.

4. The multi-input differential amplifier of claim 1, wherein when an input signal of the first and second input signal is at the first/second level, and all of the other input signal of the first and second input signals and the third to fourth input signals are at the second/first level, the transconductance compensation circuit increases a transconductance of the first and second transconductances corresponding to the input signal, and decreases the other transconductance of the first and second transconductances corresponding to the other input signal.

5. The multi-input differential amplifier of claim 1, wherein each of the first to fourth differential input pairs comprises a first type input transistor pair, and when the first input signal is at the first/second level, the second input signal is at the second/first level, and the third to fourth input signals are both at the second/first level, the transconductance compensation circuit increases a transconductance of the first type input transistor pair of the first differential input pair, and decreases the transconductance of the first type input transistor pair of the second differential input pair.

6. The multi-input differential amplifier of claim 5, wherein each of the first to fourth differential input pairs further comprises a second type input transistor pair, and the transconductance compensation circuit increases a transconductance of the second type input transistor pair of the first differential input pair, and decreases a transconductance of the second type input transistor pair of the second differential input pair when the first input signal is at the first/second level, the second input signal is at the second/first level, and both the third to fourth input signals are at the second/first level, respectively.

7. The multi-input differential amplifier of claim 1, wherein the transconductance compensation circuit does not compensate the first and the second transconductance when the first input signal and the second input signal are at substantially same levels.

8. The multi-input differential amplifier of claim 1, wherein the first differential input pair comprises a first reference current source, the second differential pair comprises a second reference current source, and the transconductance compensation circuit comprises a variable resistor, coupled between the first reference current source and the second reference current source.

9. The multi-input differential amplifier of claim 8, wherein the transconductance compensation circuit further comprises:
   a resistance value controller, coupled to the variable resistor, for controlling the resistance value of the variable resistor in response to the levels of the first and the second input signals.

10. The multi-input differential amplifier of claim 9, wherein the resistance value controller decides the resistance value of the variable resistor according to a reference current value of the first reference current source and the second reference current source and original values of the first and second transconductances.

11. A multi-input differential amplifier with dynamic transconductance compensation, comprising:
   an input stage, comprising a plurality of differential input pairs, for generating a pair of differential signals according to a plurality of input signals and an output signal;
   an output stage, for generating the output signal in response to the pair of differential signals; and
   one or more transconductance compensation circuits, wherein each compensation circuit is coupled between two corresponding differential input pairs of the plurality of differential input pairs, for dynamically compensating transconductances of the two corresponding differential input pairs.

12. The multi-input differential amplifier of claim 11, wherein each of the transconductance compensation circuits receives an individual control signal to dynamically compensate the transconductances of the two corresponding differential input pairs, wherein the individual control signal corresponds to a level combination of the input signals.

13. The multi-input differential amplifier of claim 11, wherein the plurality of differential input pairs comprise a reference current source, respectively, and each of the one or more transconductance compensation circuit is coupled between two reference current sources of the two corresponding differential input pairs.

14. The multi-input differential amplifier of claim 11, wherein each the transconductance compensation circuit does not compensate the transconductances when the input signals of the two corresponding differential input pairs are at substantially same levels.

15. The multi-input differential amplifier of claim 11, wherein each of the plurality of differential input pairs comprises a reference current source, and the transconductance compensation circuits comprise a variable resistor, coupled between the two corresponding reference current sources.

16. The multi-input differential amplifier of claim 15, wherein each of the one or more transconductance compensation circuits further comprises a resistance value controller, coupled to the variable resistor of the corresponding transconductance compensation circuit, for controlling the resistance value of the variable resistor in response to levels of two corresponding input signals of a plurality of input signals.

17. The multi-input differential amplifier of claim 16, wherein the resistance value controller decides the resistance value of the corresponding variable resistor according to a reference current value of the two reference current source and original transconductance values of the two corresponding differential input pairs.

18. A multi-input differential amplifier with dynamic transconductance compensation, comprising:
    an input stage, comprising a plurality of differential input pairs; and
    one or more transconductance compensation circuits, each coupled between two corresponding pairs of the plurality of differential input pairs, wherein each the transconductance compensation circuit comprises:
        a variable resistor, coupled between the two corresponding differential input pairs; and
        a resistance value controller, coupled to the variable resistor, for dynamically controlling a resistance value of the variable resistor.

19. The multi-input differential amplifier of claim 18, wherein the resistance value controller dynamically controls the resistance value of the variable resistor according to levels of two input signals of the two corresponding differential input pairs.

20. The multi-input differential amplifier of claim 18, wherein the two corresponding differential input pairs comprise a first and a second reference current source, and the variable resistor of the transconductance compensation circuit is coupled between the first and second reference current sources.

* * * * *